US009640407B2

(12) United States Patent
Yamato et al.

(10) Patent No.: US 9,640,407 B2
(45) Date of Patent: May 2, 2017

(54) POLISHING COMPOSITION

(75) Inventors: Yasuyuki Yamato, Kiyosu (JP); Youhei Takahashi, Kiyosu (JP); Tomohiko Akatsuka, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/123,889

(22) PCT Filed: May 31, 2012

(86) PCT No.: PCT/JP2012/064046
§ 371 (c)(1),
(2), (4) Date: Dec. 4, 2013

(87) PCT Pub. No.: WO2012/172983
PCT Pub. Date: Dec. 20, 2012

(65) Prior Publication Data
US 2014/0094033 A1 Apr. 3, 2014

(30) Foreign Application Priority Data

| Jun. 14, 2011 | (JP) | 2011-132412 |
| Jun. 14, 2011 | (JP) | 2011-132413 |
| Dec. 26, 2011 | (JP) | 2011-284285 |
| Dec. 26, 2011 | (JP) | 2011-284286 |

(51) Int. Cl.
| H01L 21/306 | (2006.01) |
| H01L 21/3105 | (2006.01) |
| H01L 21/321 | (2006.01) |
| C09K 3/14 | (2006.01) |
| C09G 1/02 | (2006.01) |

(52) U.S. Cl.
CPC ......... H01L 21/30625 (2013.01); C09G 1/02 (2013.01); C09K 3/1436 (2013.01); C09K 3/1463 (2013.01); H01L 21/31053 (2013.01); H01L 21/3212 (2013.01)

(58) Field of Classification Search
CPC ......... H01L 21/30625; H01L 21/31053; H01L 21/3212; C09G 1/02; C09K 3/1463; C09K 3/1436
See application file for complete search history.

(56) References Cited

U.S. PATENT DOCUMENTS

| 6,383,239 | B1 | 5/2002 | Suzuki et al. |
| 6,419,174 | B1* | 7/2002 | McGill ..................... A61K 8/25 423/335 |
| 7,416,942 | B2* | 8/2008 | Matsui et al. ................. 438/257 |
| 8,974,691 | B2* | 3/2015 | Tsuchiya ............... B24B 37/044 252/79.4 |
| 2001/0044210 | A1 | 11/2001 | Nakabayashi et al. |
| 2003/0124858 | A1 | 7/2003 | Nakabayashi et al. |
| 2003/0139048 | A1* | 7/2003 | Wong ........................ B08B 3/00 438/692 |
| 2006/0060974 | A1 | 3/2006 | Hirano et al. |
| 2007/0148978 | A1* | 6/2007 | Han ..................... B24B 37/044 438/692 |
| 2007/0181851 | A1* | 8/2007 | Yamada ................... C09G 1/04 252/79.1 |
| 2007/0224760 | A1 | 9/2007 | Matsui et al. |
| 2007/0293047 | A1* | 12/2007 | Fukushima et al. .......... 438/692 |
| 2008/0045020 | A1* | 2/2008 | Kim et al. .................... 252/79.1 |
| 2008/0104893 | A1 | 5/2008 | Oh |
| 2009/0197413 | A1 | 8/2009 | Shimizu et al. |
| 2009/0197414 | A1* | 8/2009 | Shimizu ................... C09G 1/02 438/693 |
| 2009/0209104 | A1 | 8/2009 | Kimura |
| 2009/0239380 | A1* | 9/2009 | Tomiga .................... C09G 1/02 438/693 |
| 2010/0181525 | A1 | 7/2010 | Belmont |
| 2011/0009033 | A1 | 1/2011 | Tanaka et al. |
| 2011/0045741 | A1* | 2/2011 | Ahn ........................ C09G 1/02 451/28 |
| 2011/0081780 | A1* | 4/2011 | Shida et al. .................. 438/693 |
| 2011/0180511 | A1* | 7/2011 | Akatsuka et al. .............. 216/83 |
| 2011/0207327 | A1* | 8/2011 | Suzuki et al. ................ 438/693 |
| 2011/0250754 | A1* | 10/2011 | Hirano .................... C08G 73/00 438/693 |
| 2011/0257054 | A1* | 10/2011 | Baran et al. .................. 508/139 |
| 2013/0146804 | A1 | 6/2013 | Mizuno et al. |
| 2013/0203254 | A1* | 8/2013 | Tamada ................ B24B 37/044 438/692 |

FOREIGN PATENT DOCUMENTS

| CN | 1266875 A | 9/2000 |
| CN | 101253607 A | 8/2008 |

(Continued)

OTHER PUBLICATIONS

International Preliminary Report on Patentability and translation of the Written Opinion of the International Searching Authority issued in Appln. No. PCT/JP2012/064046, dated Dec. 17, 2013.

Primary Examiner — Anita Alanko
(74) Attorney, Agent, or Firm — Foley & Lardner LLP

(57) ABSTRACT

A polishing composition of the present invention contains a water-soluble polymer having a hydrophilic group, and abrasive grains. A hydrophobic silicon-containing part after being polished with the polishing composition has a water contact angle lower than that of the hydrophobic silicon-containing part after being polished with another composition having the same makeup as the polishing composition except that the water-soluble polymer is not contained therein. Examples of the water-soluble polymer include polysaccharides and alcohol compounds. Another polishing composition of the present invention contains abrasive grains having a silanol group, and a water-soluble polymer. When this polishing composition is left to stand for one day in an environment at a temperature of 25° C., the water-soluble polymer is adsorbed on the abrasive grains at 5,000 or more molecules per 1 μm² of surface area of the abrasive grains. Examples of this water-soluble polymer include nonionic compounds having a polyoxyalkylene chain.

15 Claims, No Drawings

(56) References Cited

FOREIGN PATENT DOCUMENTS

| | | | |
|---|---|---|---|
| CN | 103180101 A | | 6/2013 |
| EP | 1 770 768 A2 | | 4/2007 |
| EP | 2 237 311 A1 | | 10/2010 |
| EP | 2 610 031 A1 | | 7/2013 |
| JP | 2001-326199 A | | 11/2001 |
| JP | 2002-329688 A | * | 11/2002 |
| JP | 2006-086462 A | | 3/2006 |
| JP | 2006-100550 A | | 4/2006 |
| JP | 2007-220759 A | | 8/2007 |
| JP | 2008-117807 A | | 5/2008 |
| JP | 2009-212378 A | | 9/2009 |
| JP | 2009-256184 A | | 11/2009 |
| JP | 2010-041029 A | | 2/2010 |
| JP | 2010-153781 A | | 7/2010 |
| JP | 2010-269985 A | | 12/2010 |
| JP | 2011165759 A | * | 8/2011 |
| WO | WO 2006-115393 A1 | * | 11/2006 |
| WO | WO 2008/004579 A1 | | 1/2008 |
| WO | WO 2009/005143 A1 | | 1/2009 |

* cited by examiner

POLISHING COMPOSITION

TECHNICAL FIELD

The present invention relates to a polishing composition that is suitable for polishing an object having a hydrophobic silicon-containing part and a hydrophilic silicon-containing part. The present invention also relates to a polishing method and a method of producing a substrate that use the polishing composition.

BACKGROUND ART

When carrying out chemical-mechanical polishing to form wiring of metal, such as copper, on semiconductor devices, the occurrence of defects known as fangs (or seams) after the polishing has been a problem in the past. In order to prevent the defects from occurring, polishing compositions such as those disclosed in Patent Documents 1 to 5 have been developed.

Plugs (contact plugs) and pads (contact pads) of semiconductor devices are formed from polysilicon (polycrystalline silicon) by chemical-mechanical polishing. When forming the plugs or pads, it is generally necessary to simultaneously polish not only parts made of polysilicon, but also parts made of silicon oxide or silicon nitride that are provided around the plugs or pads. In such cases, defects known as edge over erosion (hereinafter called EOE) may occur after the polishing in addition to fangs occurred as is the case with when forming metal wiring. It is thought that the occurrence of fangs and EOE is caused by the fact that while polysilicon parts are hydrophobic, silicon oxide parts or silicon nitride parts are hydrophilic. A fang as used herein refers to a phenomenon in which localized erosion is occurred at a boundary between a polysilicon part and a silicon oxide part or a silicon nitride part, and this is seen in particular on both sides of a relatively wide polysilicon part. EOE as used herein refers to a phenomenon in which localized erosion is occurred on both sides of a region in which relatively narrow polysilicon parts are aligned with little space therebetween. In addition to fangs and EOE, the problem of dishing, that is, dish shaped recesses, occurs due to the upper surface of a polysilicon part being lowered by excessive polishing and removal of the polysilicon part. Even when the polishing compositions disclosed in Patent Documents 1 to 5 are used, it is difficult to prevent the occurrence of defects such as fangs, EOE, and dishing during the formation of plugs or pads made of polysilicon.

PRIOR ART DOCUMENTS

Patent document 1: International Publication No. WO 2009/005143
Patent document 2: Japanese Laid-Open Patent Publication No. 2010-41029
Patent document 3: Japanese Laid-Open Patent Publication No. 2009-256184
Patent document 4: Japanese Laid-Open Patent Publication No. 2006-86462
Patent document 5: International Publication No. WO 2008/004579

SUMMARY OF THE INVENTION

Problems that the Invention is to Solve

Accordingly, the objectives of the present invention are to provide a polishing composition that can be advantageously used in polishing an object having a hydrophobic silicon-containing part and a hydrophilic silicon-containing part, and to provide a polishing method and a method of producing a substrate that use the polishing composition.

Means for Solving the Problems

In order to achieve the foregoing objectives and in accordance with a first aspect of the present invention, a polishing composition is provided that contains a water-soluble polymer having a hydrophilic group, and abrasive grains. A hydrophobic silicon-containing part after an object having the hydrophobic silicon-containing part and a hydrophilic silicon-containing part with the polishing composition has a water contact angle lower than that of the hydrophobic silicon-containing part after the same object is polished with another composition having the same makeup as the polishing composition except that the water-soluble polymer is not contained therein, and has a water contact angle of preferably 57° or less.

In the polishing composition according to the first aspect, it is preferable for the water-soluble polymer to have three or more hydrophilic groups per molecule.

In the polishing composition according to the first aspect, it is preferable for the water-soluble polymer to be a polysaccharide or an alcohol compound, and especially a polyether.

A second aspect of the present invention provides a polishing composition that contains abrasive grains having a silanol group, and a water-soluble polymer. When the polishing composition is left to stand for one day in an environment at a temperature of 25° C., the water-soluble polymer is adsorbed on the abrasive grains at 5,000 or more molecules per 1 $\mu m^2$ of surface area of the abrasive grains.

In the polishing composition according to the second aspect, it is preferable for the water-soluble polymer to be a nonionic compound having a polyoxyalkylene chain.

In the polishing composition according to the second aspect, it is preferable for the nonionic compound having a polyoxyalkylene chain to be polyethylene glycol, polypropylene glycol, a polyoxyethylene alkylene diglyceryl ether, a polyoxyethylene alkyl ether, or a polyoxyethylene sorbitan fatty acid ester.

In the polishing compositions according to the first and second aspects, it is preferable for the abrasive grains to be formed of silica on which an organic acid is immobilized.

In the polishing compositions according to the first and second aspects, the polishing composition is used in polishing an object having a hydrophobic silicon-containing part and a hydrophilic silicon-containing part. The hydrophobic silicon-containing part is made of, for example, polysilicon.

A third aspect of the present invention provides a method of polishing an object having a hydrophobic silicon-containing part and a hydrophilic silicon-containing part with the polishing composition according to the first or second aspect.

A fourth aspect of the present invention provides a method of producing a substrate by polishing an object having a hydrophobic silicon-containing part and a hydrophilic silicon-containing part with the polishing composition according to the first or second aspect.

Effects of the Invention

According to the present invention, it is possible to provide a polishing composition that can be advantageously used in polishing an object having a hydrophobic silicon-containing part and a hydrophilic silicon-containing part, and a polishing method and a method of producing a substrate that use the polishing composition.

MODE FOR CARRYING OUT THE INVENTION

First Embodiment

A polishing composition according to the first embodiment is prepared by mixing abrasive grains and a water-soluble polymer with water. Therefore, the polishing composition contains abrasive grains and a water-soluble polymer.

The polishing composition is used in polishing an object having a hydrophobic silicon-containing part and a hydrophilic silicon-containing part, and is also used in producing a substrate by polishing the object. The hydrophobic silicon-containing part is made of, for example, polysilicon. The hydrophilic silicon-containing part is made of, for example, silicon oxide or silicon nitride. In cases where the object is polished with the polishing composition of the first embodiment, the effect of improving the wettability of the surface of the hydrophobic silicon-containing parts is achieved due to the water-soluble polymer in the polishing composition being adsorbed on this surface, as a result of which it is possible to suppress the occurrence of fangs and EOE and, in some cases, dishing as well.

The polishing composition of the first embodiment is not intended to be used in polishing a metal, and therefore does not contain a component such as an oxidizing agent and a metal corrosion inhibitor, which is generally contained in metal polishing compositions.

The water-soluble polymer contained in the polishing composition of the first embodiment has a hydrophilic group, such as hydroxy group, carboxy group, amino group, and ether group. More specifically, the water-soluble polymer can be, for example, a polysaccharide, an alcohol compound, a polyether, a polycarboxylic acid, or a salt thereof. Alternatively, the water-soluble polymer can be a nonionic compound having a polyoxyalkylene chain.

The number of hydrophilic groups in the water-soluble polymer is preferably 3 or more, more preferably 5 or more, and further preferably 10 or more, per molecule. As the number of hydrophilic groups in the water-soluble polymer increases, the hydrophilization effect on an object to be polished, and especially a hydrophobic silicon-containing part, increases, as a result of which it is possible to further suppress the occurrence of fangs and EOE and, in some cases, dishing as well.

In addition, the water-soluble polymer is selected from the group of compounds so that a hydrophobic silicon-containing part after an object having the hydrophobic silicon-containing part and a hydrophilic silicon-containing part with the polishing composition of the first embodiment has a water contact angle lower than that of the hydrophobic silicon-containing part after the same object is polished with another composition having the same makeup as the polishing composition except that the water-soluble polymer is not contained therein, and is selected from the group of such compounds so that the water contact angle is preferably 57° or less, more preferably 50° or less, and further preferably 45° or less. As the water contact angle of a hydrophobic silicon-containing part after being polished with the polishing composition of the first embodiment decreases, it is possible to further suppress the occurrence of fangs and EOE and, in some cases, dishing as well.

Specific examples of the water-soluble polymer include polysaccharides, such as alginic acid, pectinic acid, carboxymethyl cellulose, starch, agar, curdlan, and pullulan; alcohol compounds, such as polyethylene glycol, polyglycerol, pentanol, polypropylene glycol, and polyvinyl alcohol (of these, polyethylene glycol, polyglycerol, and polypropylene glycol are both alcohol compounds and polyethers); nonionic compounds, such as polyoxyethylene (hereinafter called POE) alkylene diglyceryl ethers, POE alkyl ethers, and sorbitan POE(6) monooleate, having a polyoxyalkylene chain; and polycarboxylic acids and salts thereof, such as polyaspartic acid, polyglutamic acid, polylysine, polymalic acid, polymethacrylic acid, ammonium polymethacrylate, sodium polymethacrylate, polymaleic acid, polyitaconic acid, polyfumaric acid, poly(p-styrene carboxylic acid), polyacrylic acid, polyacrylamide, aminopolyacrylamide, methyl polyacrylate, ethyl polyacrylate, ammonium polyacrylate, sodium polyacrylate, polyamic acids, ammonium salts of polyamic acids, sodium salts of polyamic acids, polyglyoxalic acid, polycarboxamides, polycarboxylate esters, and polycarboxylate salts.

The content of the water-soluble polymer in the polishing composition of the first embodiment is preferably 10 ppm by mass or more, more preferably 50 ppm by mass or more, and further preferably 100 ppm by mass or more. As the content of the water-soluble polymer increases, the water contact angle of a hydrophobic silicon-containing part after being polished with the polishing composition decreases, as a result of which it is possible to further suppress the occurrence of fangs and EOE and, in some cases, dishing as well.

The content of the water-soluble polymer in the polishing composition of the first embodiment is also preferably 100,000 ppm by mass or less, more preferably 50,000 ppm by mass or less, and further preferably 10,000 ppm by mass or less. As the content of the water-soluble polymer decreases, aggregation of the abrasive grains in the polishing composition occurs less readily, as a result of which the storage stability of the polishing composition is improved.

The molecular weight of the water-soluble polymer is preferably 100 or more, and more preferably 300 or more. As the molecular weight of the water-soluble polymer increases, it is possible for the water-soluble polymer to be effectively adsorbed on the surface of the hydrophobic silicon-containing part, as a result of which the water contact angle of the hydrophobic silicon-containing part after being polished with the polishing composition is further reduced.

The molecular weight of the water-soluble polymer is preferably 500,000 or less, and more preferably 300,000 or less. As the molecular weight of the water-soluble polymer decreases, aggregation of the abrasive grains in the polishing composition occurs less readily, as a result of which the storage stability of the polishing composition is improved.

The abrasive grains contained in the polishing composition of the first embodiment may be inorganic particles, organic particles, or organic-inorganic composite particles. Specific examples of inorganic particles include particles made of metal oxides, such as silica, alumina, ceria, and titania; silicon nitride particles; silicon carbide particles; and boron nitride particles. Specific examples of organic particles include polymethyl methacrylate (PMMA) particles. Of these, silica particles are preferred, and colloidal silica is particularly preferred.

The abrasive grains may be surface modified. Ordinary colloidal silica has a zeta potential value that is close to 0 under an acidic condition, as a result of which the silica particles do not undergo mutual electrical repulsion and readily aggregate under an acidic condition. However, surface-modified abrasive grains which have a relatively large negative zeta potential even under an acidic condition disperse well under an acidic condition due to undergoing strong mutual repulsion, and therefore improve the storage stability of the polishing composition. Such surface-modified abrasive grains can be obtained by, for example, mixing abrasive grains with a metal, such as aluminum, titanium, and zirconium, or an oxide thereof so as to dope the surface of the abrasive grains.

Alternatively, the surface-modified abrasive grains in the polishing composition may be silica on which an organic acid is immobilized. Especially, colloidal silica on which an organic acid is immobilized can be preferably used. The immobilization of an organic acid on colloidal silica is carried out by chemically bonding a functional group of the organic acid to the surface of the colloidal silica. The immobilization of an organic acid on colloidal silica cannot be achieved by only allowing the colloidal silica and the organic acid to coexist. The immobilization of a sulfonic acid, which is one of organic acids, on colloidal silica can be carried out, for example, by the method described in "Sulfonic acid-functionalized silica through quantitative oxidation of thiol groups", Chem. Commun. 246-247 (2003). Specifically, colloidal silica in which a sulfonic acid is immobilized on the surface thereof can be obtained by coupling a silane coupling agent having a thiol group, such as 3-mercaptopropyl trimethoxysilane, to colloidal silica, followed by oxidizing the thiol group by means of hydrogen peroxide. The immobilization of a carboxylic acid on colloidal silica can be carried out, for example, by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, colloidal silica in which a carboxylic acid is immobilized on the surface thereof can be obtained by coupling a silane coupling agent including photoreactive 2-nitrobenzyl ester to colloidal silica, followed by photoirradiation.

The content of the abrasive grains in the polishing composition of the first embodiment is preferably 0.1% by mass or more, more preferably 0.5% by mass or more, and further preferably 1% by mass or more. As the content of the abrasive grains increases, the rates of removal of the hydrophobic silicon-containing part and hydrophilic silicon-containing part by the polishing composition are increased.

The content of the abrasive grains in the polishing composition of the first embodiment is also preferably 20% by mass or less, more preferably 15% by mass or less, and further preferably 10% by mass or less. As the content of the abrasive grains decreases, it is possible to suppress the material cost of the polishing composition and aggregation of the abrasive grains occurs less readily. In addition, by polishing the object with the polishing composition, it is easy to obtain a polished surface having few scratches.

The average primary particle diameter of the abrasive grains is preferably 5 nm or more, more preferably 7 nm or more, and further preferably 10 nm or more. As the average primary particle diameter of the abrasive grains increases, the rates of removal of the hydrophobic silicon-containing part and hydrophilic silicon-containing part by the polishing composition are increased. The average primary particle diameter of the abrasive grains can be calculated from the specific surface area of the abrasive grains, as measured by, for example, the BET method.

The average primary particle diameter of the abrasive grains is also preferably 100 nm or less, more preferably 90 nm or less, and further preferably 80 nm or less. As the average primary particle diameter of the abrasive grains decreases, it is easy to obtain a polished surface having few scratches by polishing the object with the polishing composition.

The average secondary particle diameter of the abrasive grains is preferably 150 nm or less, more preferably 120 nm or less, and further preferably 100 nm or less. The average secondary particle diameter of the abrasive grains can be measured by, for example, a laser scattering method.

The average degree of association of the abrasive grains, which is calculated by dividing the average secondary particle diameter by the average primary particle diameter, is preferably 1.2 or more, and more preferably 1.5 or more. As the average degree of association of the abrasive grains increases, the rates of removal of the hydrophobic silicon-containing part and hydrophilic silicon-containing part by the polishing composition are increased.

The average degree of association of the abrasive grains is preferably 4 or less, more preferably 3 or less, and further preferably 2 or less. As the average degree of association of the abrasive grains decreases, it is easy to obtain a polished surface having few scratches by polishing the object with the polishing composition.

Second Embodiment

A polishing composition according to the second embodiment is prepared by mixing abrasive grains and a water-soluble polymer with water, in the same way as the polishing composition of the first embodiment. Therefore, the polishing composition of the second embodiment also contains abrasive grains and a water-soluble polymer.

The polishing composition of the second embodiment is used in, for example, polishing an object having a hydrophobic silicon-containing part and a hydrophilic silicon-containing part, and is also used in producing a substrate by polishing the object. The hydrophobic silicon-containing part is made of, for example, polysilicon. The hydrophilic silicon-containing part is made of, for example, silicon oxide or silicon nitride. In cases where the object is polished with the polishing composition of the second embodiment, the properties of the abrasive grains change due to a prescribed quantity or more of the water-soluble polymer being adsorbed on the surface of the abrasive grains, as a result of which it is possible to suppress the occurrence of fangs, EOE, and dishing.

The polishing composition of the second embodiment is not intended to be used in polishing a metal, and therefore, like the polishing composition of the first embodiment, does not contain a component such as an oxidizing agent and a metal corrosion inhibitor, which is generally contained in metal polishing compositions.

The abrasive grains contained in the polishing composition of the second embodiment have a silanol group. Typical examples of abrasive grains having a silanol group include silica particles, with colloidal silica being preferred. It is possible to use abrasive grains obtained by adding a silanol group to abrasive grains other than silica particles by carrying out surface modification.

Other details relating to the abrasive grains in the polishing composition of the second embodiment are the same as for the abrasive grains used in the polishing composition of the first embodiment, which have already been explained, and these details are omitted here in order to avoid duplication.

The water-soluble polymer contained in the polishing composition of the second embodiment is selected from the group of water-soluble polymers so that when the polishing composition is left to stand for one day in an environment at a temperature of 25° C., the water-soluble polymer is adsorbed on the abrasive grains at 5,000 or more molecules per 1 µm² of surface area of the abrasive grains. The use of a nonionic compound having a polyoxyalkylene chain is preferred because oxygen atoms in the polyoxyalkylene chain undergo hydrogen bonding to a silanol group in the abrasive grains. Specific examples of nonionic compounds having a polyoxyalkylene chain include polyethylene glycol, polypropylene glycol, POE alkylene diglyceryl ethers, POE alkyl ethers, POE sorbitan fatty acid esters, POE alkyl phenyl ethers, POE glycol fatty acid esters, POE hexytane fatty acid esters, POE polypropylene alkyl ethers, and polyoxypropylene/polyoxyethylene block/random copolymers.

The content of the water-soluble polymer in the polishing composition of the second embodiment is preferably 10 ppm by mass or more, more preferably 50 ppm by mass or more, and further preferably 100 ppm by mass or more. As the content of the water-soluble polymer increases, it is possible for the water-soluble polymer to be effectively adsorbed on the surface of the abrasive grains, as a result of which it is possible to further suppress the occurrence of fangs, EOE, and dishing.

The content of the water-soluble polymer in the polishing composition of the second embodiment is also preferably 100,000 ppm by mass or less, more preferably 50,000 ppm by mass or less, and further preferably 10,000 ppm by mass or less. As the content of the water-soluble polymer decreases, aggregation of the abrasive grains in the polishing composition occurs less readily, as a result of which the storage stability of the polishing composition is improved.

The pH of the polishing compositions of the first and second embodiments is preferably 12 or less, more preferably 11 or less, and further preferably 10 or less. As the pH of the polishing composition decreases, etching of the hydrophobic silicon-containing part by the polishing composition occurs less readily, as a result of which it is possible to further suppress the occurrence of dishing.

A pH adjusting agent, which is used if necessary in order to adjust the pH of the polishing compositions of the first and second embodiments to the desired pH value, can be either an acid or an alkali, and can be either an inorganic or organic compound.

The following actions and effects can be achieved by the first and second embodiments.

Since the water-soluble polymer contained in the polishing composition of the first embodiment has a hydrophilic group, the wettability of the surface of a hydrophobic silicon-containing part is improved by the adsorption of the water-soluble polymer to this surface. This is thought to be the reason why in cases where an object having a hydrophobic silicon-containing part and a hydrophilic silicon-containing part is polished with the polishing composition of the first embodiment, it is possible to suppress the occurrence of fangs and EOE and, in some cases, the occurrence of dishing as well. Therefore, the polishing composition of the first embodiment can be advantageously used in polishing the object.

The polishing composition of the second embodiment contains a water-soluble polymer that can be adsorbed at a prescribed quantity or more on the surface of abrasive grains having a silanol group under specific conditions. The properties of the abrasive grains change due to a prescribed quantity or more of the water-soluble polymer being adsorbed on the surface of the abrasive grains. This is thought to be the reason why in cases where an object having a hydrophobic silicon-containing part and a hydrophilic silicon-containing part is polished with the polishing composition of the second embodiment, it is possible to suppress the occurrence of fangs, EOE, and dishing. Therefore, the polishing composition of the second embodiment can be advantageously used in polishing the object.

In cases where the pH of the polishing compositions of the first and second embodiments is acidic (for example, a pH of 6 or less) and colloidal silica on which an organic acid is immobilized is used as the abrasive grains contained in the polishing composition, it is possible to further suppress the occurrence of fangs, EOE, and dishing. The reason for this is that while colloidal silica on which an organic acid is immobilized has a negative zeta potential in the acidic pH region, a hydrophobic silicon-containing part made of, for example, polysilicon in an object also has a negative zeta potential in the acidic pH region. In other words, the abrasive grains in the polishing composition electrically repel the hydrophobic silicon-containing part of the object in the acidic pH region, as a result of which fangs, EOE, and dishing hardly occur that are caused by excessive polishing of the hydrophobic silicon-containing part by the abrasive grains.

In cases where the pH of the polishing compositions of the first and second embodiments is acidic (for example, a pH of 6 or less) and colloidal silica on which an organic acid is immobilized is used as the abrasive grains contained in the polishing composition, it is possible to increase the polishing rate of a hydrophilic silicon-containing part in an object by using the polishing composition. The reason for this is that while colloidal silica on which an organic acid is immobilized has a negative zeta potential in the acidic pH region, a hydrophilic silicon-containing part made of, for example, silicon oxide or silicon nitride in an object has a positive zeta potential in the acidic pH region. In other words, the abrasive grains in the polishing composition do not electrically repel the hydrophilic silicon-containing part of the object in the acidic pH region, as a result of which mechanical polishing of the hydrophilic silicon-containing part by the abrasive grains is facilitated.

In cases where colloidal silica on which an organic acid is immobilized is used as the abrasive grains contained in the polishing compositions of the first and second embodiments, it is possible to obtain a polishing composition having excellent storage stability over a long period of time. The reason for this is that colloidal silica on which an organic acid is immobilized tends to have a higher absolute zeta potential value in a polishing composition than ordinary colloidal silica, on which an organic acid is not immobilized. As the absolute value of the zeta potential in the polishing composition increases, electrostatic repulsion between silica particles increases, as a result of which aggregation of colloidal silica due to attraction caused by Van der Waals forces occurs less readily. For example, the zeta potential of colloidal silica on which an organic acid is immobilized is generally −15 mV or less in the acidic pH region, whereas the zeta potential of ordinary colloidal silica is close to 0 in the acidic pH region.

The first and second embodiments may be modified as follows.

The polishing composition of the first embodiment may contain two or more types of water-soluble polymer. In such cases, it is not necessary for all of the water-soluble polymers to have a hydrophilic group, and it is not necessary for all of the water-soluble polymers to exhibit the effect of reducing the water contact angle of a hydrophobic silicon-containing part.

The polishing composition of the second embodiment may contain two or more types of water-soluble polymer. In such cases, it is not necessary for all of the water-soluble polymers to exhibit the property of adsorbing to the surface of abrasive grains.

composition to 3. The details of the water-soluble polymers used in the polishing compositions are as shown in Table 1.

Although not shown in Table 1, the polishing compositions of Working Examples 1 to 12 and Comparative Examples 1 to 3 all contained 5% by mass of colloidal silica on which a sulfonic acid was immobilized (average primary particle diameter: 35 nm, average secondary particle diameter: 70 nm, average degree of association: 2).

TABLE 1

| | | Water-soluble polymer | | | | |
|---|---|---|---|---|---|---|
| | Type | Molecular weight | Content [ppm by mass] | Hydrophilic group | number of hydrophilic groups per molecule | Polyoxyalkylene chain (Y/N) |
| Comparative Example 1 | — | — | — | — | — | — |
| Working Example 1 | pullulan | 200,000 | 5,000 | —OH | 2,500 | N |
| Working Example 2 | polyethylene glycol | 400 | 5,000 | —OH—O— | 10 | Y |
| Working Example 3 | polyethylene glycol | 1,000 | 5,000 | —OH—O— | 25 | Y |
| Working Example 4 | polyglycerol | 310 | 5,000 | —OH—O— | 7 | N |
| Working Example 5 | polyglycerol | 750 | 5,000 | —OH—O— | 17 | N |
| Working Example 6 | pentanol | 88 | 5,000 | —OH—O— | 1 | N |
| Working Example 7 | polypropylene glycol | 400 | 5,000 | —OH—O— | 7 | Y |
| Working Example 8 | polypropylene glycol | 1,000 | 5,000 | —OH—O— | 15 | Y |
| Working Example 9 | POE alkylene diglyceryl ether | 400 | 200 | —OH—O— | 8 | Y |
| Working Example 10 | POE alkyl ether | 350 | 200 | —O— | 3 | Y |
| Working Example 11 | sorbitan POE(6) monooleate | 500 | 200 | —O— | 6 | Y |
| Working Example 12 | polyvinyl alcohol | 22,000 | 5,000 | —OH | 500 | N |
| Comparative Example 2 | ammonium lauryl sulfate | 290 | 200 | —SO$_3$— | 1 | N |
| Comparative Example 3 | triethanolamine POE lauryl ether sulfate | 400 | 200 | —SO$_3$— | 1 | Y |

The polishing compositions of the first and second embodiments may, if necessary, further contain a known additive, such as a corrosion inhibitor.

The polishing composition of the first or second embodiment may be a one-component composition or a multi-component composition, such as a two-component composition.

The polishing composition of the first or second embodiment may be prepared by diluting a stock solution of the polishing composition with water.

Next, working examples and comparative examples of the present invention will be described.

Working Examples 1 to 12 and Comparative Examples 1 to 3

A polishing composition of Comparative Example 1 was prepared by diluting a colloidal silica sol with water and adding an organic acid as a pH adjusting agent so as to adjust the pH value of the composition to 3. Polishing compositions of Working Examples 1 to 12 and Comparative Examples 2 and 3 were prepared by diluting a colloidal silica sol with water, adding a water-soluble polymer thereto, and adding an organic acid so as to adjust the pH value of the The polishing compositions of Working Examples 1 to 12 and Comparative Examples 1 to 3 were evaluated in terms of dispersion stability, and the results are shown in the "Dispersion stability" column in Table 2. In this column, "1" indicates that gelation was observed in the polishing composition immediately after preparation, "2" indicates that gelation was not observed immediately after preparation but that gelation was observed after storing the polishing composition for 1 week under accelerated high temperature conditions at 60° C., and "3" indicates that gelation was not observed even after storing the polishing composition for 1 week under accelerated high temperature conditions at 60° C.

Using each of the polishing compositions of Working Examples 1 to 12 and Comparative Examples 1 to 3, a patterned poly-Si/HDP wafer having a diameter of 200 mm and including a part made of polysilicon and a part made of silicon oxide deposited by high density plasma CVD was polished under the conditions shown in Table 3. Polishing of the patterned wafer was carried out until the upper surface of the polysilicon part was exposed, after which further polishing was continued for 15 seconds and then stopped.

The polished patterned wafers were rinsed with pure water and dried by being blown with dry air, after which the water contact angle of the polysilicon part was measured by the θ/2 method using a commercially available water contact angle evaluation device. The results are shown in the "Water contact angle" column in Table 2.

Using an atomic force microscope, the degree of progress of fangs and degree of progress of dishing were measured in a region of each of the polished patterned wafers in which polysilicon parts having a width of 100 μm were formed at intervals of 100 μm. The results are shown in the "Degree of progress of fangs" and "Degree of progress of dishing" columns in the "100 μm/100 μm region" column in Table 2.

Using an atomic force microscope, the degree of progress of EOE and degree of progress of dishing were measured in a region of each of the polished patterned wafers in which polysilicon parts having a width of 0.25 μm were formed at intervals of 0.25 μm. The results are shown in the "Degree of progress of EOE" and "Degree of progress of dishing" columns in the "0.25 μm/0.25 μm region" column in Table 2.

cases, the degree of progress of fangs and the degree of progress of EOE were lower than in a case in which the polishing composition of Comparative Example 1 was used. Of these, in cases in which the polishing compositions of Working Examples 1 to 3 and 6 to 12 were used, the degree of progress of dishing in addition to the degree of progress of fangs and the degree of progress of EOE was found to be lower than in a case in which the polishing composition of Comparative Example 1 was used. Contrastingly, in cases in which the polishing compositions of Comparative Examples 2 and 3 were used, the water contact angle of the polysilicon part after polishing was higher than in a case in which the polishing composition of Comparative Example 1 was used, and in these cases, it was not even found that the degree of progress of EOE was lower than in a case in which the polishing composition of Comparative Example 1 was used.

TABLE 2

|  | Storage stability | Water contact angle (°) | 100 μm/100 μm region | | 0.25 μm/0.25 μm region | |
| --- | --- | --- | --- | --- | --- | --- |
|  |  |  | Degree of progress of fangs (Å) | Degree of progress of dishing (Å) | Degree of progress of EOE (Å) | Degree of progress of dishing (Å) |
| Comparative Example 1 | 3 | 59.6 | 167 | 52 | 211 | 178 |
| Working Example 1 | 3 | 20.0 | 0 | 35 | 0 | 80 |
| Working Example 2 | 3 | 54.9 | 137 | 39 | 147 | 104 |
| Working Example 3 | 3 | 53.0 | 82 | 30 | 106 | 106 |
| Working Example 4 | 3 | 46.1 | 97 | 59 | 144 | 136 |
| Working Example 5 | 3 | 43.5 | 121 | 62 | 136 | 119 |
| Working Example 6 | 3 | 56.0 | 127 | 22 | 92 | 111 |
| Working Example 7 | 3 | 52.4 | 125 | 39 | 100 | 56 |
| Working Example 8 | 3 | 52.8 | 31 | −20 | 0 | 0 |
| Working Example 9 | 3 | 53.5 | 61 | 21 | 59 | 101 |
| Working Example 10 | 3 | 55.7 | 79 | 23 | 130 | 54 |
| Working Example 11 | 3 | 56.5 | 114 | 13 | 112 | 78 |
| Working Example 12 | 3 | 32.6 | 31 | −80 | 0 | 78 |
| Comparative Example 2 | 3 | 62.4 | 39 | 95 | 215 | 85 |
| Comparative Example 3 | 3 | 61.1 | 93 | 172 | 278 | 75 |

TABLE 3

Polishing machine: Single-side CMP polishing machine
Polishing pad: Polyurethane polishing pad
Polishing pressure: 2 psi (≈28 kPa)
Rotational speed of surface platen: 100 rpm
Polishing composition: Continuously fed without being circulated
Rotational speed of carrier: 100 rpm As shown in Table 2, in cases in which the polishing compositions of Working Examples 1 to 12 were used, the water contact angle of the polysilicon part after polishing was lower than in a case in which the polishing composition of Comparative Example 1, which did not contain a water-soluble polymer, was used, and it was found that in these Working Examples 13 to 18 and Comparative Examples 4 to 8

A polishing composition of Comparative Example 4 was prepared by diluting a colloidal silica sol with water and adding an organic acid as a pH adjusting agent so as to adjust the pH value of the composition to 3. Polishing compositions of Working Examples 13 to 18 and Comparative Examples 4 to 8 were prepared by diluting a colloidal silica sol with water, adding a water-soluble polymer thereto, and adding an organic acid so as to adjust the pH value of the composition to 3. The details of the water-soluble polymers used in the polishing compositions are as shown in Table 4.

Although not shown in Table 4, the polishing compositions of Working Examples 13 to 18 and Comparative Examples 4 to 8 all contained 5% by mass of colloidal silica on which a sulfonic acid was immobilized (average primary particle diameter: 35 nm, average secondary particle diameter: 70 nm, average degree of association: 2).

TABLE 4

| | Water-soluble polymer | | | |
|---|---|---|---|---|
| | Type | Molecular weight | Content (ppm by mass) | Polyoxyalkylene chain (Y/N) |
| Comparative Example 4 | — | — | — | — |
| Working Example 13 | polyethylene glycol | 1,000 | 5,000 | Y |
| Working Example 14 | polypropylene glycol | 400 | 5,000 | Y |
| Working Example 15 | polypropylene glycol | 1,000 | 5,000 | Y |
| Working Example 16 | POE alkylene diglyceryl ether | 400 | 200 | Y |
| Working Example 17 | POE alkyl ether | 350 | 200 | Y |
| Working Example 18 | sorbitan POE(6) monooleate | 500 | 200 | Y |
| Comparative Example 5 | polyglycerol | 310 | 5,000 | N |
| Comparative Example 6 | polyglycerol | 750 | 5,000 | N |
| Comparative Example 7 | ammonium lauryl sulfate | 290 | 200 | N |
| Comparative Example 8 | triethanolamine POE lauryl ether sulfate | 400 | 200 | Y |

The polishing compositions of Working Examples 13 to 18 and Comparative Examples 4 to 8 were evaluated in terms of dispersion stability, and the results are shown in the "Dispersion stability" column in Table 5. In this column, "1" indicates that gelation was observed in the polishing composition immediately after preparation, "2" indicates that gelation was not observed immediately after preparation but that gelation was observed after storing the polishing composition for 1 week under accelerated high temperature conditions at 60° C., and "3" indicates that gelation was not observed even after storing the polishing composition for 1 week under accelerated high temperature conditions at 60° C.

The polishing compositions of Working Examples 13 to 18 and Comparative Examples 4 to 8 were measured in terms of the number of molecules of water-soluble polymer adsorbed per unit area of colloidal silica, as follows. That is, the polishing compositions were left to stand for one day in an environment at a temperature of 25° C. and subjected to centrifugal separation at 20,000 rpm for 2 hours, after which the supernatant liquid was collected. The total quantity of organic carbon in the collected supernatant liquid was measured using a combustion catalytic oxidation type organic carbon measurement apparatus. Separately, compositions that had the same makeup as the polishing compositions except that the colloidal silica was not contained therein were prepared and left to stand for one day in an environment at a temperature of 25° C. and, in the same way as described above, the total quantity of organic carbon in the composition was measured using a combustion catalytic oxidation type organic carbon measurement apparatus. Then, by subtracting the total quantity of organic carbon in the collected supernatant liquid of the corresponding polishing composition from this value, the total quantity of water-soluble polymer adsorbed on the colloidal silica in the polishing composition was calculated. The number of water-soluble polymer molecules adsorbed per unit area of colloidal silica was calculated from this calculated adsorbed quantity by taking into account the surface area of the colloidal silica and the molecular weight of the water-soluble polymer. The results are shown in the "Number of adsorbed molecules per $\mu m^2$ of colloidal silica" in Table 5.

Using each of the polishing compositions of Working Examples 13 to 18 and Comparative Examples 4 to 8, a patterned poly-Si/HDP wafer having a diameter of 200 mm and including a part made of polysilicon and a part made of silicon oxide deposited by high density plasma CVD was polished under the conditions shown in Table 6. Polishing of the patterned wafer was carried out until the upper surface of the polysilicon part was exposed, after which further polishing was continued for 15 seconds and then stopped.

Using an atomic force microscope, the degree of progress of fangs and degree of progress of dishing were measured in a region of each of the polished patterned wafers in which polysilicon parts having a width of 100 μm were formed at intervals of 100 μm. The results are shown in the "Degree of progress of fangs" and "Degree of progress of dishing" columns in the "100 μm/100 μm region" column in Table 5.

Using an atomic force microscope, the degree of progress of EOE and degree of progress of dishing were measured in a region of each of the polished patterned wafers in which polysilicon parts having a width of 0.25 μm were formed at intervals of 0.25 μm. The results are shown in the "Degree of progress of EOE" and "Degree of progress of dishing" columns in the "0.25 μm/0.25 μm region" column in Table 5.

TABLE 5

| | Storage stability | Number of molecules adsorbed per $\mu m^2$ of colloidal silica | 100 μm/100 μm region | | 0.25 μm/0.25 μm region | |
|---|---|---|---|---|---|---|
| | | | Degree of progress of fangs (Å) | Degree of progress of dishing (Å) | Degree of progress of EOE (Å) | Degree of progress of dishing (Å) |
| Comparative Example 4 | 3 | — | 167 | 52 | 211 | 178 |
| Working Example 13 | 3 | 7,025 | 82 | 30 | 106 | 106 |
| Working Example 14 | 3 | 7,477 | 125 | 39 | 100 | 56 |
| Working Example 15 | 3 | 15,926 | 31 | −20 | 0 | 0 |
| Working Example 16 | 3 | 65,756 | 61 | 21 | 59 | 101 |

TABLE 5-continued

| | Storage stability | Number of molecules adsorbed per μm² of colloidal silica | 100 μm/100 μm region | | 0.25 μm/0.25 μm region | |
|---|---|---|---|---|---|---|
| | | | Degree of progress of fangs (Å) | Degree of progress of dishing (Å) | Degree of progress of EOE (Å) | Degree of progress of dishing (Å) |
| Working Example 17 | 3 | 27,368 | 79 | 23 | 130 | 54 |
| Working Example 18 | 3 | 48,426 | 114 | 13 | 112 | 78 |
| Comparative Example 5 | 3 | 0 | 97 | 59 | 144 | 136 |
| Comparative Example 6 | 3 | 0 | 121 | 62 | 136 | 119 |
| Comparative Example 7 | 3 | 4,558 | 39 | 95 | 215 | 85 |
| Comparative Example 8 | 3 | 1,669 | 93 | 172 | 278 | 75 |

TABLE 6

Polishing machine: Single-side CMP polishing machine
Polishing pad: Polyurethane polishing pad
Polishing pressure: 2 psi (≅28 kPa)
Rotational speed of platen: 100 rpm
Polishing composition: Continuously fed without being circulated
Rotational speed of carrier: 100 rpm As shown in Table 5, it was found that in cases where the polishing compositions of Working Examples 13 to 18, in which 5,000 or more molecules of the water-soluble polymer were adsorbed per μm² of surface area of the colloidal silica, were used, the degree of progress of fangs, the degree of progress of EOE, and the degree of progress of dishing were lower than in a case where the polishing composition of Comparative Example 4, which did not contain a water-soluble polymer, was used. Contrastingly, it was not found that in cases where the polishing compositions of Comparative Examples 5 to 8, in which fewer than 5,000 molecules of the water-soluble polymer were adsorbed per μm² of surface area of the colloidal silica, were used, the degree of progress of fangs, the degree of progress of EOE, or the degree of progress of dishing was lower than in a case where the polishing composition of Comparative Example 4 was used.

The invention claimed is:

1. A polishing composition used in polishing an object having a hydrophobic silicon-containing part and a hydrophilic silicon-containing part, the polishing composition comprising a water-soluble polymer having a hydrophilic group, and abrasive grains,
   wherein the polishing composition does not contain an oxidizing agent or a metal corrosion inhibitor,
   wherein the water-soluble polymer is polyglycerol, pentanol, polypropylene glycol, a polyoxyethylene alkylene diglyceryl ether, a polyoxyethylene alkyl ether, or polyoxyethylene sorbitan monooleate,
   wherein the abrasive grains are formed of colloidal silica on which an organic acid is immobilized,
   wherein the abrasive grains have an average primary particle diameter of 5 nm or more and 100 nm or less,
   wherein the abrasive grains have an average secondary particle diameter of 150 nm or less,
   wherein the polishing composition has a pH of 6 or less, and
   wherein the hydrophobic silicon-containing part after the object is polished with the polishing composition has a water contact angle lower than that of the hydrophobic silicon-containing part after the object is polished with another composition having the same makeup as the polishing composition except that the water-soluble polymer is not contained therein.

2. The polishing composition according to claim 1, wherein the water contact angle of the hydrophobic silicon-containing part after the object is polished with the polishing composition is 57° or less.

3. The polishing composition according to claim 1, wherein the water-soluble polymer has three or more hydrophilic groups per molecule.

4. The polishing composition according to claim 1, wherein the water-soluble polymer is polyglycerol, pentanol, or polypropylene glycol.

5. The polishing composition according to claim 4, wherein the alcohol compound is polyglycerol or polypropylene glycol.

6. The polishing composition according to claim 1, wherein the hydrophobic silicon-containing part is made of polysilicon.

7. A polishing composition comprising abrasive grains having a silanol group, and a water-soluble polymer,
   wherein the polishing composition does not contain an oxidizing agent or a metal corrosion inhibitor,
   wherein the water-soluble polymer is polypropylene glycol, a polyoxyethylene alkylene diglyceryl ether, a polyoxyethylene alkyl ether, or a polyoxyethylene sorbitan fatty acid ester,
   wherein the abrasive grains are formed of colloidal silica on which an organic acid is immobilized,
   wherein the abrasive grains have an average primary particle diameter of 5 nm or more and 100 nm or less,
   wherein the abrasive grains have an average secondary particle diameter of 150 nm or less,
   wherein the polishing composition has a pH of 6 or less, and
   wherein when the polishing composition is left to stand for one day in an environment at a temperature of 25° C., the water-soluble polymer is adsorbed on the abrasive grains at 5,000 or more molecules per 1 μm² of surface area of the abrasive grains.

8. The polishing composition according to claim 7, wherein the polishing composition is used in polishing an object having a hydrophobic silicon-containing part and a hydrophilic silicon-containing part.

9. The polishing composition according to claim 8, wherein the hydrophobic silicon-containing part is made of polysilicon.

10. A polishing method comprising:
providing an object having a hydrophobic silicon-containing part and a hydrophilic silicon-containing part; and
using a polishing composition to polish the object, the polishing composition containing a water-soluble polymer having a hydrophilic group, and abrasive grains,
wherein the water-soluable polymer is polyglycerol, pentanol, polypropylene glycol, a polyoxyethylene alkylene diglyceryl ether, a polyoxyethylene alkyl ether, or polyoxyethylene sorbitan monooleate,
wherein the abrasive grains are formed of silica on which an organic acid is immobilized,
wherein the polishing composition has a pH of 6 or less, and
wherein the hydrophobic silicon-containing part after the object is polished with the polishing composition has a water contact angle lower than that of the hydrophobic silicon-containing part after the object is polished with another composition having the same makeup as the polishing composition except that the water-soluble polymer is not contained therein.

11. A method of producing a polished substrate, comprising:
providing a substrate having a hydrophobic silicon-containing part and a hydrophilic silicon-containing part; and
using the polishing composition according to claim 1 to polish the substrate.

12. A polishing method comprising:
providing an object having a hydrophobic silicon-containing part and a hydrophilic silicon-containing part; and
using a polishing composition to polish the object, the polishing composition abrasive grains having a silanol group, and a water-soluble polymer,
wherein the water-soluble polymer is polypropylene glycol, a polyoxyethylene alkylene diglyceryl ether, a polypropethylene alkyl ether, or an polyoxyethylene sorbitan fatty acid ester,
wherein the abrasive grains are formed of silica on which an organic acid is immobilized,
wherein the polishing composition has a pH of 6 or less, and
wherein when the polishing composition is left to stand for one day in an environment at a temperature of 25° C., the water-soluble polymer is adsorbed on the abrasive grains at 5,000 or more molecules per 1 $\mu m^2$ of surface area of the abrasive grains.

13. A method of producing a polished substrate, comprising:
providing a substrate having a hydrophobic silicon-containing part and a hydrophilic silicon-containing part; and
using the polishing composition according to claim 7 to polish the substrate.

14. The polishing composition to claim 1, wherein the water-soluble polymer is polyglycerol, pentanol, a polyoxyethylene alkylene diglyceryl ether, a polyoxyethylene alkyl ether, or polyoxyethylene sorbitan monooleate.

15. The polishing composition according to claim 7, wherein the water-soluble polymer is a polyoxyethylene alkylene diglyceryl ether, a polyoxyethylene alkyl ether, or a polyoxyethylene sorbitan fatty acid ester.

* * * * *